(12) United States Patent
Kinoshita et al.

(10) Patent No.: US 12,191,846 B2
(45) Date of Patent: Jan. 7, 2025

(54) DETERMINATION DEVICE AND SWITCH SYSTEM EQUIPPED THEREWITH

(71) Applicant: Panasonic Intellectual Property Management Co., Ltd., Osaka (JP)

(72) Inventors: Yusuke Kinoshita, Kyoto (JP); Hidetoshi Ishida, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 154 days.

(21) Appl. No.: 17/904,384

(22) PCT Filed: Feb. 16, 2021

(86) PCT No.: PCT/JP2021/005593
§ 371 (c)(1),
(2) Date: Aug. 17, 2022

(87) PCT Pub. No.: WO2021/199738
PCT Pub. Date: Oct. 7, 2021

(65) Prior Publication Data
US 2023/0082396 A1   Mar. 16, 2023

(30) Foreign Application Priority Data
Mar. 30, 2020 (JP) ................ 2020-061518

(51) Int. Cl.
*H03K 17/082* (2006.01)
*H03K 17/0812* (2006.01)
*H03K 17/687* (2006.01)

(52) U.S. Cl.
CPC ... *H03K 17/0822* (2013.01); *H03K 17/08122* (2013.01); *H03K 17/6871* (2013.01)

(58) Field of Classification Search
CPC ............. H03K 17/082; H03K 17/0822; H03K 17/081; H02H 3/08; H02H 7/12; H02H 5/041; H02M 1/08
(Continued)

(56) References Cited

U.S. PATENT DOCUMENTS

| | | | | | |
|---|---|---|---|---|---|
| 5,914,545 | A | * | 6/1999 | Pollersbeck | H03K 17/0822 307/131 |
| 6,057,728 | A | * | 5/2000 | Igarashi | H03K 17/0828 327/427 |

(Continued)

FOREIGN PATENT DOCUMENTS

| JP | 2007-202238 A | 8/2007 |
|---|---|---|
| JP | 2010-166793 | 7/2010 |

(Continued)

OTHER PUBLICATIONS

International Search Report of PCT application No. PCT/JP2021/005593 dated May 11, 2021.

*Primary Examiner* — Danny Nguyen
(74) *Attorney, Agent, or Firm* — Rimon P.C.

(57) ABSTRACT

Provided are a determination device and a switch system capable of suppressing a power loss of a semiconductor switch. Determination device is used for semiconductor switch. Semiconductor switch includes junction field-effect transistor having gate and source corresponding to gate. Determination device includes resistor and determination circuit. Resistor has a first end and a second end. The first end of resistor is connected to gate. Determination circuit determines that overcurrent is flowing through semiconductor switch when there is a predetermined change in gate-source voltage of junction field-effect transistor in a range smaller than gate drive voltage provided between the second end of resistor and source.

13 Claims, 11 Drawing Sheets

(58) Field of Classification Search
USPC .................................. 361/86–87, 93.7–93.9
See application file for complete search history.

(56) References Cited

U.S. PATENT DOCUMENTS

| | | |
|---|---|---|
| 2013/0154391 A1 | 6/2013 | Urciuoli |
| 2017/0192049 A1 | 7/2017 | Tavernier et al. |
| 2019/0131964 A1 | 5/2019 | Bryant |
| 2021/0028702 A1 | 1/2021 | Morokuma et al. |
| 2021/0226620 A1* | 7/2021 | Nakada .............. H03K 17/0826 |

FOREIGN PATENT DOCUMENTS

| | | |
|---|---|---|
| JP | 2011-182066 | 9/2011 |
| JP | 2013-123329 A | 6/2013 |
| JP | 2017-523636 A | 8/2017 |
| JP | 2019-519182 | 7/2019 |
| WO | 2018/203422 | 11/2018 |
| WO | 2019/225121 | 11/2019 |

\* cited by examiner

DETERMINATION DEVICE AND SWITCH SYSTEM EQUIPPED THEREWITH

CROSS-REFERENCE TO RELATED APPLICATIONS

This application is a U.S. national stage application of the PCT International Application No. PCT/JP2021/005593 filed on Feb. 16, 2021, which claims the benefit of foreign priority of Japanese patent application No. 2020-061518 filed on Mar. 30, 2020, the contents all of which are incorporated herein by reference.

FIELD OF THE INVENTION

The present disclosure relates to a determination device used for a semiconductor switch and a switch system equipped therewith. More specifically, the present disclosure relates to a determination device for overcurrent detection used for a semiconductor switch, and a switch system equipped therewith.

DESCRIPTION OF THE RELATED ART

PTL 1 discloses a protection circuit for a power semiconductor element. The protection circuit for a power semiconductor element disclosed in PTL 1 includes a drive circuit that drives a power semiconductor element, a current detector including a first resistor and an inductor connected in parallel, and a detector that detects a short-circuit state of the power semiconductor element. One end of the first resistor and one end of the inductor are connected to one terminal of the power semiconductor element. The detector detects the short-circuit state of the power semiconductor element by comparing a voltage of one terminal of the power semiconductor element, which changes according to a current flowing through the first resistor and the inductor, with a short-circuit detection voltage. A reference potential of the drive circuit is connected to the other end of the first resistor and the other end of the inductor.

CITATION LIST

Patent Literature

PTL 1: WO 2019/225121 A

SUMMARY OF THE INVENTION

In the determination device for overcurrent detection used for the semiconductor switch, it may be desired to reduce a power loss in a path through which a main current of the semiconductor switch flows.

An object of the present disclosure is to provide a determination device for overcurrent detection used for a semiconductor switch capable of suppressing a power loss, and a switch system equipped therewith.

A determination device according to one aspect of the present disclosure is used for a semiconductor switch. The semiconductor switch includes a junction field-effect transistor having a gate and a source corresponding to the gate. The determination device includes a resistor and a determination circuit. The resistor has a first end and a second end. The first end of the resistor is connected to the gate. The determination circuit determines that an overcurrent is flowing through the semiconductor switch when there is a predetermined change in a gate-source voltage of the junction field-effect transistor in a range smaller than a gate drive voltage given between the second end of the resistor and the source.

A switch system according to another aspect of the present disclosure includes a determination device and a semiconductor switch.

The determination device and the switch system of the present disclosure can suppress a power loss.

DETAILED DESCRIPTION OF THE PREFERRED EMBODIMENTS

First Exemplary Embodiment

Figure 1:
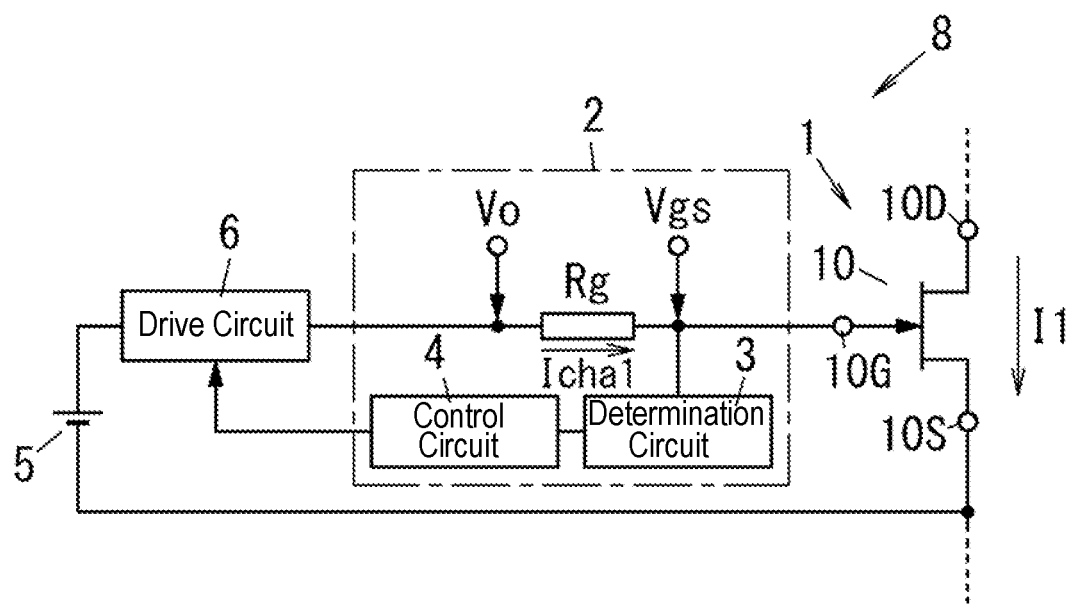
FIG. 1 is a circuit diagram of a switch system including a determination device according to a first exemplary embodiment.

FIG. 1 is a circuit diagram of switch system 8 including determination device 2 according to a first exemplary embodiment. Hereinafter, determination device 2 according to the first exemplary embodiment and switch system 8 equipped therewith will be described with reference to FIGS. 1 and 2.

(1) Outline

Determination device 2 is used for semiconductor switch 1.

Semiconductor switch 1 includes junction field-effect transistor 10 having gate 10G and source 10S corresponding to gate 10G. Junction field-effect transistor 10 has drain 10D corresponding to gate 10G. Determination device 2 is used to determine whether an overcurrent is flowing between a pair of main terminals of semiconductor switch 1.

Determination device 2 includes resistor Rg and determination circuit 3. Resistor Rg has a first end and a second end. The first end of resistor Rg is connected to gate 10G. When there is a predetermined change in gate-source voltage Vgs of junction field-effect transistor 10 within a range smaller than gate drive voltage Vo given between the second end of resistor Rg and source 10S, determination circuit 3 determines that an overcurrent is flowing through semiconductor switch 1.

Switch system 8 includes determination device 2 and semiconductor switch 1. Switch system 8 further includes DC power supply 5 and drive circuit 6. Drive circuit 6 supplies gate drive voltage Vo to junction field-effect transistor 10 via resistor Rg. Determination device 2 further includes control circuit 4. Control circuit 4 controls semiconductor switch 1 based on the determination result of determination circuit 3. Here, control circuit 4 controls semiconductor switch 1 by controlling drive circuit 6 based on the determination result of determination circuit 3.

(2) Each Component of Switch System

(2.1) Semiconductor Switch

Semiconductor switch 1 includes junction field-effect transistor 10 (hereinafter, also referred to as JFET 10). JFET 10 is, for example, a gallium nitride (GaN)-based gate injection transistor (GIT). For example, JFET 10 does not include a metal-oxide-semiconductor field effect transistor (MOSFET).

JFET 10 includes, for example, a substrate, a buffer layer, a first nitride semiconductor layer, a second nitride semiconductor layer, a source electrode, a gate electrode, a drain electrode, and a p-type layer. The buffer layer is formed on the substrate. The first nitride semiconductor layer is formed on the buffer layer. The second nitride semiconductor layer is formed on the first nitride semiconductor layer. The source electrode, the gate electrode, and the drain electrode are formed on the second nitride semiconductor layer. The p-type layer is interposed between the gate electrode and the second nitride semiconductor layer. In JFET 10, the second nitride semiconductor layer and the p-type layer constitute diode Dgu (see FIG. 2). Gate 10G in JFET 10 includes a gate electrode and a p-type layer. Source 10S in JFET 10 includes a source electrode. Drain 10D in JFET 10 includes a drain electrode. The substrate is, for example, a silicon substrate. The buffer layer is, for example, an undoped GaN layer. The first nitride semiconductor layer is, for example, an undoped GaN layer. The second nitride semiconductor layer is, for example, an undoped AlGaN layer. The p-type layer is, for example, a p-type AlGaN layer. Each of the buffer layer, the first nitride semiconductor layer, and the second nitride semiconductor layer may contain impurities such as Mg, H, Si, C, and O inevitably mixed during growth by metal organic vapor phase epitaxy (MOVPE) or the like.

(2.2) Drive Circuit

Drive circuit 6 is connected to gate 10G of JFET 10. In switch system 8 according to the first exemplary embodiment, drive circuit 6 is connected to gate 10G of JFET 10 via resistor Rg.

Drive circuit 6 is a circuit that applies a gate voltage to gate 10G of JFET 10. Drive circuit 6 outputs gate drive voltage Vo corresponding to a DC voltage supplied from DC power supply 5.

Drive circuit 6 includes a power supply terminal and a ground terminal. The ground terminal of drive circuit 6 is connected to source 10S of JFET 10.

DC power supply 5 having an output terminal on a high potential side and an output terminal on a low potential side is connected between the power supply terminal and the ground terminal of drive circuit 6. The output terminal on the high potential side of DC power supply 5 is connected to the power supply terminal of drive circuit 6. The output terminal on the low potential side of DC power supply 5 is connected to the ground terminal of drive circuit 6. An output voltage of DC power supply 5 is, for example, 12 V. DC power supply 5 is an isolated power supply. DC power supply 5 is not a component of drive circuit 6.

Drive circuit 6 includes, for example, a driver integrated circuit (IC). The driver IC is, for example, a complementary metal-oxide semiconductor (CMOS) inverter, and includes an anti-series circuit of a p-channel MOSFET and an n-channel MOSFET. The anti-series circuit is connected between the output terminal on the high potential side and the output terminal on the low potential side of DC power supply 5. In this anti-series circuit, drains of the p-channel MOSFET and the n-channel MOSFET are connected to each other, a source of the p-channel MOSFET is connected to the output terminal on the high potential side of DC power supply 5, and a source of the n-channel MOSFET is connected to the output terminal on the low potential side of DC power supply 5.

(2.3) Determination Device

Determination device 2 includes resistor Rg and determination circuit 3. Resistor Rg is an element for determining gate-source voltage Vgs applied between gate 10G and source 10S of semiconductor switch 1 in a steady on-state of semiconductor switch 1. A resistance value of Rg is, for example, 800Ω. In determination device 2, the first end of resistor Rg is connected to gate 10G of JFET 10. In determination device 2, the second end of resistor Rg is connected to drive circuit 6. In short, determination device 2 includes a resistor Rg connected between drive circuit 6 and gate 10G of JFET 10. Determination circuit 3 determines that an overcurrent is flowing through semiconductor switch 1 when there is a predetermined change in gate-source voltage Vgs of JFET 10 within a range smaller than gate drive voltage Vo given between the second end of resistor Rg and source 10S.

The predetermined change in gate-source voltage Vgs includes, for example, a change determined by a threshold. In this case, for example, determination circuit 3 determines that an overcurrent is flowing through semiconductor switch 1 when gate-source voltage Vgs becomes larger than reference voltage Vref (when a condition of Vref<Vgs<Vo is satisfied) by using reference voltage Vref smaller than gate drive voltage Vo as a threshold. Here, the overcurrent is a current having a magnitude exceeding a rated current of main current I1 flowing between the pair of main terminals (drain 10D and source 10S) of semiconductor switch 1, and is, for example, a short circuit current. Determination circuit 3 includes, for example, a comparator that compares gate-source voltage Vgs with reference voltage Vref.

The predetermined change in gate-source voltage Vgs is not limited to the change determined by the threshold, and may include a change determined by the amount of change in gate-source voltage Vgs. The amount of change may be a change rate (dVgs/dt) of gate-source voltage Vgs.

Control circuit 4 controls drive circuit 6 based on the determination result of determination circuit 3. An execution subject of control circuit 4 (controller) includes a computer system. The computer system includes one or a plurality of computers. The computer system mainly includes a processor and a memory as hardware. The processor executes a program recorded in the memory of the computer system, and thus, functions of the execution subject of control circuit 4 (controller) in the present disclosure are achieved. The program may be recorded into the memory of the computer system in advance but may be provided through a telecommunication line or may be provided in a state of being recorded in a non-transitory recording medium such as a memory card, an optical disk, or a hard disk drive (magnetic disk) capable of being read in the computer system. The processor of the computer system includes one or a plurality of electronic circuits including a semiconductor integrated circuit (IC) or a large-scale integration (LSI). The plurality of electronic circuits may be integrated into one chip or may be provided in a distributed manner on a plurality of chips. The plurality of chips may be aggregated in one device or may be provided in a distributed manner in a plurality of devices.

(3) Operation

An operation example of switch system 8 will be described with reference to FIGS. 2 and 3A to 3C. FIGS. 2 and 3A to 3C are operation explanatory diagrams of switch system 8 including determination device 2.

Figure 2:
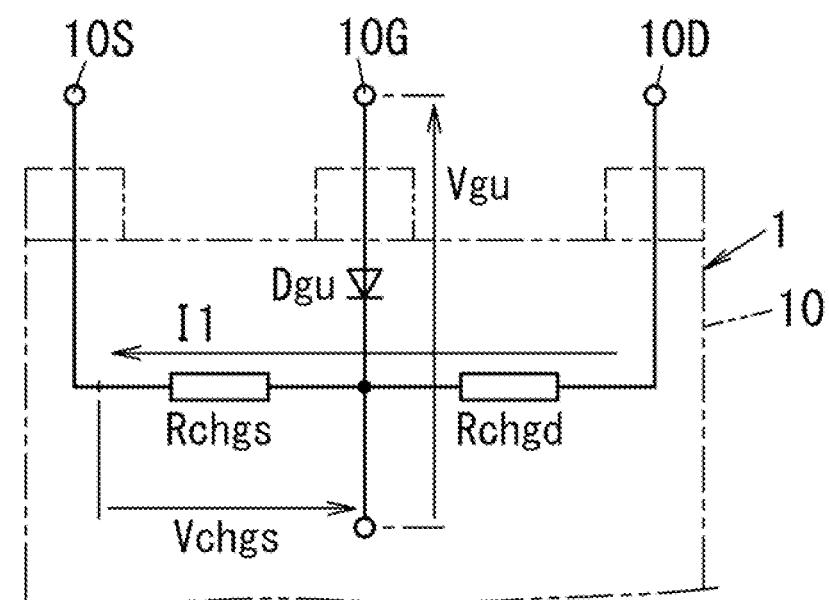
FIG. 2 is an operation explanatory diagram of the switch system including the determination device.

In FIG. 2, voltage Vgu applied to diode Dgu, channel resistance Rchgd between the gate and the drain of JFET 10, channel resistance Rchgs between the gate and the source of JFET 10, voltage drop Vchgs at channel resistance Rchgs, and main current I1 between the gate and the source are denoted on a schematic equivalent circuit of JFET 10.

Figure 3A:
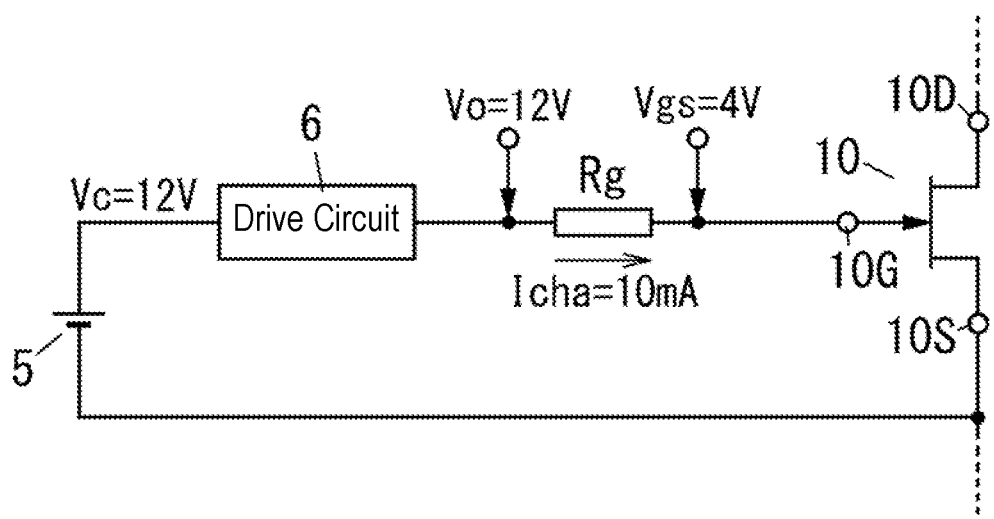
FIG. 3A is an operation explanatory diagram of the switch system including the determination device, and is an operation explanatory diagram when the switch is turned on and is normal.
Figure 3B:
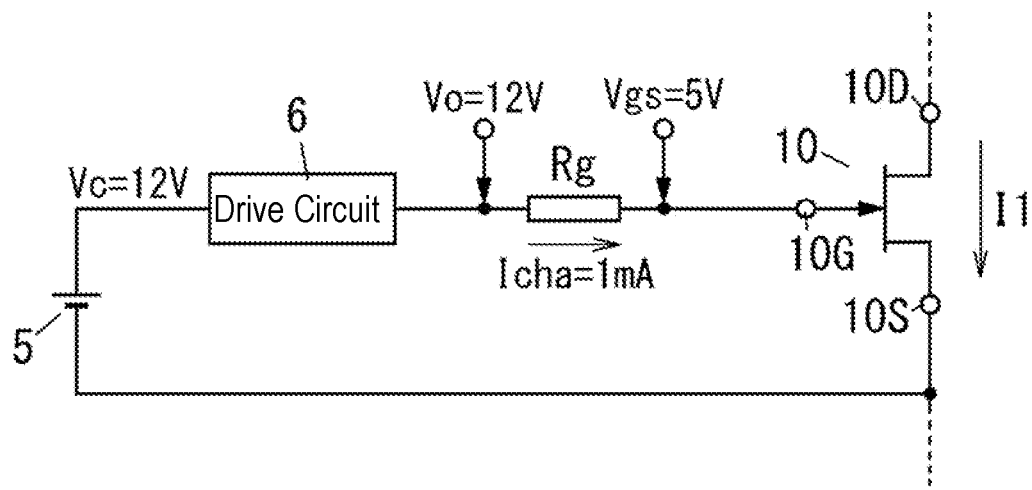
FIG. 3B is an operation explanatory diagram of the switch system including the determination device, and is an operation explanatory diagram when the switch is turned on and an overcurrent flows.
Figure 3C:
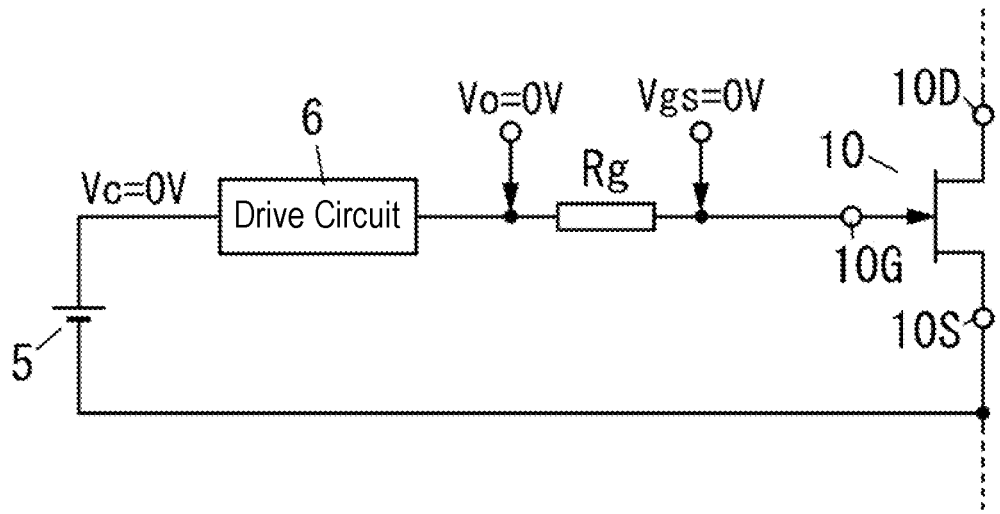
FIG. 3C is an operation explanatory diagram of the switch system including the determination device, and is an operation explanatory diagram when the switch is turned off and is normal.

FIG. 3A is an operation explanatory diagram in a normal state where semiconductor switch 1 is in an on-state and an overcurrent is not flowing through semiconductor switch 1. FIG. 3B is an operation explanatory diagram when an overcurrent flows through semiconductor switch 1. FIG. 3C is an operation explanatory diagram in a normal state where semiconductor switch 1 is in an off-state and an overcurrent is not flowing through the semiconductor switch.

Switch system 8 is used by connecting a load circuit between drain 10D and source 10S of semiconductor switch 1. In switch system 8, in a state (that is, Vgs=4V) in which gate-source voltage Vgs is applied to gate 10G of JFET 10 at a predetermined voltage (4 V) higher than a threshold voltage (for example, 3.2 V) of JFET 10, as illustrated in FIG. 3A, charge current Icha is flowing through gate 10G of JFET 10 at a predetermined current value (for example, 10 mA). In switch system 8, for example, output voltage Vc of DC power supply 5 is 12 V, gate drive voltage Vo is 12 V, the threshold voltage of JFET 10 is 3.2 V, the predetermined voltage is 4 V, the resistance value of resistor Rg is 1 kΩ, the predetermined current value is 10 mA, and reference voltage Vref is 4.5 V, but the present disclosure is not limited to these values.

When main current I1 flowing between the drain and the source of JFET 10 becomes an overcurrent, voltage drop Vchgs in channel resistance Rchgs increases. As a result, in JFET 10, voltage Vgu applied to diode Dgu decreases. When voltage Vgu decreases, since a forward current flowing through diode Dgu decreases, charge current Icha decreases to 1 mA as illustrated in FIG. 3B. When the decrease in charge current Icha is ΔIcha, gate-source voltage Vgs of the JFET becomes a value (5 V) increased by (resistance value of resistor Rg)×ΔIcha from a value (4 V) in the normal state. Thus, determination circuit 3 can determine that an overcurrent is flowing when gate-source voltage Vgs becomes larger than reference voltage Vref (=4.5 V). In determination device 2, when determination circuit 3 determines that the overcurrent is flowing, control circuit 4 controls semiconductor switch 1 by stopping drive circuit 6 and setting gate drive voltage Vo to 0 V.

In switch system 8, when output voltage Vc of DC power supply 5 is 0 V, as illustrated in FIG. 3C, when semiconductor switch 1 is in a normal off-state, gate drive voltage Vo becomes 0 V, and gate-source voltage Vgs becomes 0 V.

(4) Advantages

In determination device 2 and switch system 8 according to the first exemplary embodiment, determination circuit 3 determines that the overcurrent is flowing through semiconductor switch 1 when there is a predetermined change in gate-source voltage Vgs of junction field-effect transistor 10 within a range smaller than gate drive voltage Vo. Thus, in determination device 2 and switch system 8 according to the first exemplary embodiment, it is possible to suppress a power loss. Here, in determination device 2 and switch system 8 according to the first exemplary embodiment, the overcurrent can be detected without connecting a shunt resistor for overcurrent detection to source 10S of junction field-effect transistor 10, and the power loss can be suppressed.

Determination device 2 according to the first exemplary embodiment includes control circuit 4, and thus, it is possible to control semiconductor switch 1 when the overcurrent flows through semiconductor switch 1.

Second Exemplary Embodiment

Figure 4:
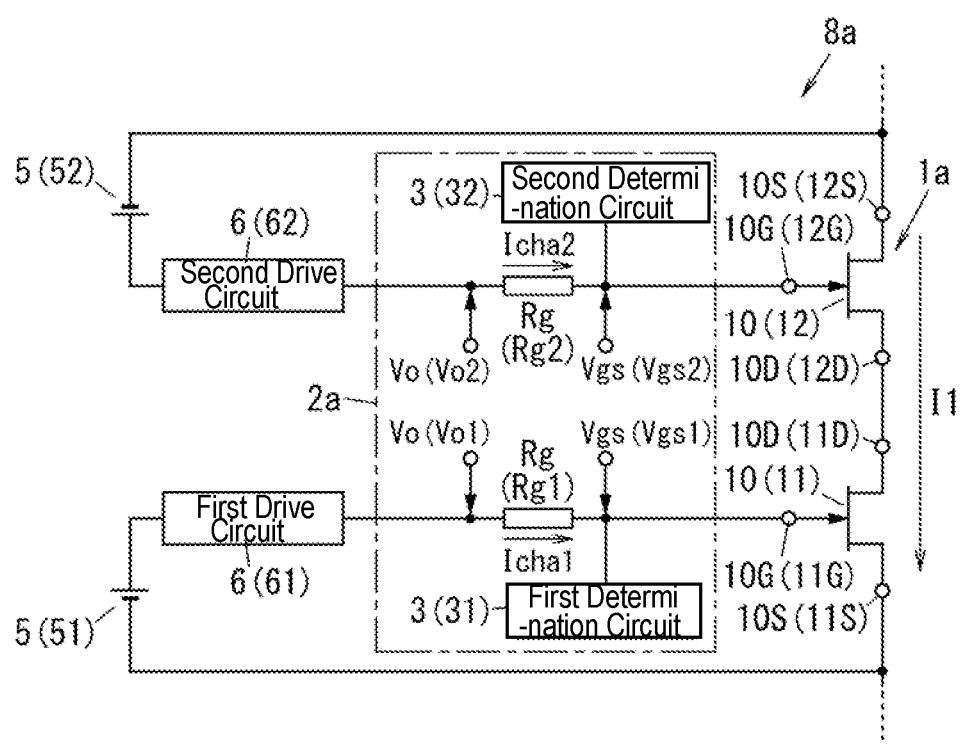
FIG. 4 is a circuit diagram of a switch system including a determination device according to a second exemplary embodiment.

Hereinafter, determination device 2a according to a second exemplary embodiment and switch system 8a equipped therewith will be described with reference to FIG. 4. FIG. 4 is a circuit diagram of switch system 8a including determination device 2a according to the second exemplary embodiment. Switch system 8a according to the second exemplary embodiment includes semiconductor switch 1a and determination device 2a instead of semiconductor switch 1 and determination device 2 of switch system 8 according to the first exemplary embodiment. Regarding determination device 2a and switch system 8a according to the second exemplary embodiment, the same components as those of determination device 2 and switch system 8 according to the first exemplary embodiment are denoted by the same reference marks, and the description thereof will be omitted.

Semiconductor switch 1a is a bidirectional switch including two junction field-effect transistors 10 (also referred to as JFETs 10). In semiconductor switch 1a, drains 10D of two JFETs 10 are connected to each other. Two junction field-effect transistors 10 include first junction field-effect transistor 11 and second junction field-effect transistor 12, respectively. Hereinafter, first junction field-effect transistor 11 is also referred to as first JFET 11. Second junction field-effect transistor 12 is also referred to as second JFET.

Hereinafter, gate 10G, source 10S, and drain 10D of first JFET 11 are also referred to as first gate 11G, first source 11S, and first drain 11D, respectively. Gate 10G, source 10S, and drain 10D of second JFET 12 are also referred to as second gate 12G, second source 12S, and second drain 12D, respectively. Gate-source voltage Vgs of first JFET 11 is also referred to as first gate-first source voltage Vgs1. Gate-source voltage Vgs of second JFET 12 is also referred to as second gate-second source voltage Vgs2. In semiconductor switch 1a, first source 11S of first JFET 11 and second source 12S of second JFET 12 constitute a pair of main terminals. Switch system 8a is used by connecting a load circuit between first source 11S and second source 12S.

Determination device 2a includes two resistors Rg and two determination circuits 3. Two resistors Rg include first resistor Rg1 corresponding to first JFET 11 and second resistor Rg2 corresponding to second JFET 12. A resistance value of second resistor Rg2 may be the same as or different from a resistance value of first resistor Rg1.

Switch system 8a includes two drive circuits 6 and two DC power supplies 5. Two drive circuits 6 include first drive circuit 61 and second drive circuit 62. Two DC power supplies 5 include first DC power supply 51 and second DC power supply 52.

First drive circuit 61 is connected to first gate 11G of first JFET 11 via first resistor Rg1. An output voltage (hereinafter, a first output voltage) of first DC power supply 51 is supplied to first drive circuit 61. The first output voltage is, for example, 12 V. An output terminal on a high potential side of first DC power supply 51 is connected to a power supply terminal of first drive circuit 61. An output terminal on a low potential side of first DC power supply 51 is connected to first source 11S of first JFET 11.

Second drive circuit 62 is connected to second gate 12G of second JFET 12 via second resistor Rg2. An output voltage (hereinafter, a second output voltage) of second DC power supply 52 is supplied to second drive circuit 62. The second output voltage is, for example, 12 V. An output terminal on a high potential side of second DC power supply 52 is connected to a power supply terminal of second drive circuit 62. An output terminal on a low potential side of second DC power supply 52 is connected to second source 12S of second JFET 12.

Hereinafter, gate drive voltage Vo output from first drive circuit 61 is also referred to as first gate drive voltage Vo1, and gate drive voltage Vo output from second drive circuit 62 is also referred to as second gate drive voltage Vo2.

Two determination circuits 3 include first determination circuit 31 corresponding to first JFET 11 and second determination circuit 32 corresponding to second JFET 12.

In switch system 8a, when semiconductor switch 1a is in an on-state, first gate-first source voltage Vgs1 is applied to first gate 11G of first JFET 11 at a first predetermined voltage (for example, 4 V) higher than a first threshold voltage (for example, 3.2 V) of first JFET 11, and first charge current Icha1 is flowing through first gate 11G of first JFET 11 at a predetermined current value. Second gate-second source voltage Vgs2 is applied to second gate 12G of second JFET 12 at a second predetermined voltage (for example, 4 V) higher than the second threshold voltage (for example, 3.2 V) of second JFET 12, and second charge current Icha2 is flowing at a predetermined current value through second gate 12G of second JFET 12.

In switch system 8a, for example, when main current I1 becomes an overcurrent in a state where main current I1 is flowing from second source 12S toward first source 11S, voltage drop Vgu in diode Dgu (see FIG. 2) of second gate 12G increases. As a result, second charge current Icha2 increases, and a voltage between second source 12S and second gate 12G decreases. As a result, second gate-second source voltage Vgs2 of second JFET 12 decreases.

In first JFET 11, when main current I1 becomes an overcurrent in a state where main current I1 is flowing from second source 12S toward first source 11S, first gate-first source voltage Vgs1 of first JFET 11 increases.

In switch system 8a, for example, when main current I1 becomes an overcurrent in a state where main current I1 is flowing from first source 11S toward second source 12S, voltage drop Vgu in diode Dgu (see FIG. 2) of first gate 11G increases. As a result, first charge current Icha1 increases, and a voltage between first source 11S and first gate 11G decreases. As a result, first gate-first source voltage Vgs1 of first JFET 11 decreases.

On the other hand, in second JFET 12, when main current I1 becomes an overcurrent in a state where main current I1 is flowing from first source 11S toward second source 12S, second gate-second source voltage Vgs2 of second JFET 12 increases.

Figure 5A:
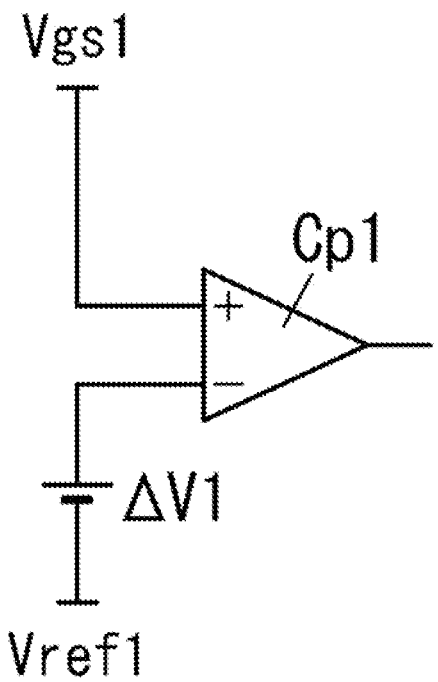
FIG. 5A is a circuit diagram of a first determination circuit in the determination device.

FIG. 5A is a circuit diagram of first determination circuit 31 in determination device 2a. For example, as illustrated in FIG. 5A, first determination circuit 31 includes comparator Cp1. In first determination circuit 31, comparator Cp1 compares first gate-first source voltage Vgs1 with a first threshold (reference voltage Vref1+ΔV1). ΔV1 is a constant voltage. (Vref1+ΔV1)<Vo1 is satisfied. In first determination circuit 31, first gate-first source voltage Vgs1 is input to a non-inverting input terminal of comparator Cp1, and the first threshold (reference voltage Vref1+ΔV1) is input to an inverting input terminal of comparator Cp1. ΔV1 is not limited to a constant voltage, and may be 0 V.

Figure 5B:
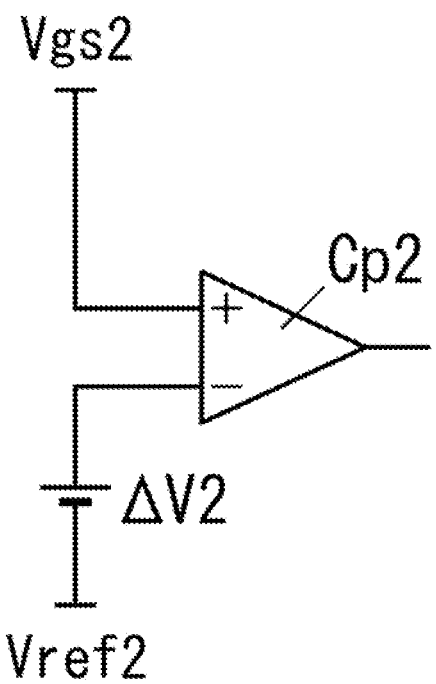
FIG. 5B is a circuit diagram of a second determination circuit in the determination device.

FIG. 5B is a circuit diagram of second determination circuit 32 in determination device 2a. For example, as illustrated in FIG. 5B, second determination circuit 32 includes comparator Cp2. In second determination circuit 32, comparator Cp2 compares second gate-second source voltage Vgs2 with a second threshold (reference voltage Vref2+ΔV2). In second determination circuit 32, second gate-second source voltage Vgs2 is input to a non-inverting input terminal of comparator Cp2, and the second threshold (reference voltage Vref2+ΔV2) is input to an inverting input terminal of comparator Cp2. ΔV2 is not limited to a constant voltage, and may be 0 V.

In determination device 2a and switch system 8a according to the second exemplary embodiment, when there is a predetermined change in gate-source voltage Vgs of junction field-effect transistor 10 within a range smaller than gate drive voltage Vo, determination circuit 3 determines that an overcurrent is flowing through semiconductor switch 1. Thus, in determination device 2a and switch system 8a according to the second exemplary embodiment, it is possible to suppress a power loss.

Figure 6A:
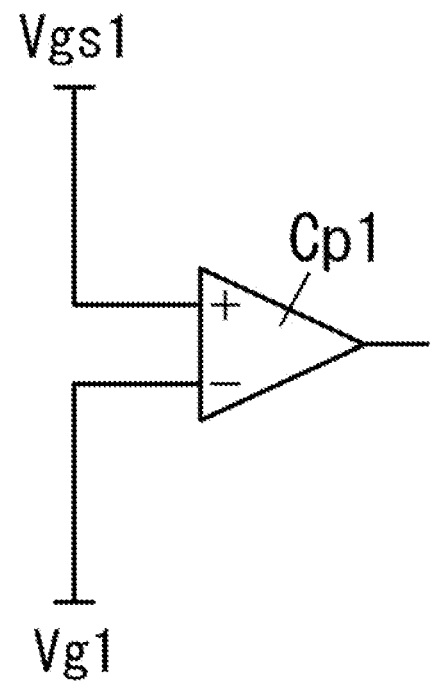
FIG. 6A is a circuit diagram illustrating another configuration example of the first determination circuit in the determination device.

FIG. 6A is a circuit diagram illustrating another configuration example of first determination circuit 31 in determination device 2a. For example, as illustrated in FIG. 6A, in first determination circuit 31, first gate-first source voltage Vgs1 may be input to the non-inverting input terminal of comparator Cp1, and first gate voltage Vg1 of first JFET 11 in a steady state (normal state) may be input to the inverting input terminal of comparator Cp1. Here, first gate voltage Vg1 in a steady state is, for example, a moving average value of a gate voltage (gate-source voltage Vgs) when first JFET 11 is turned on.

Figure 6B:
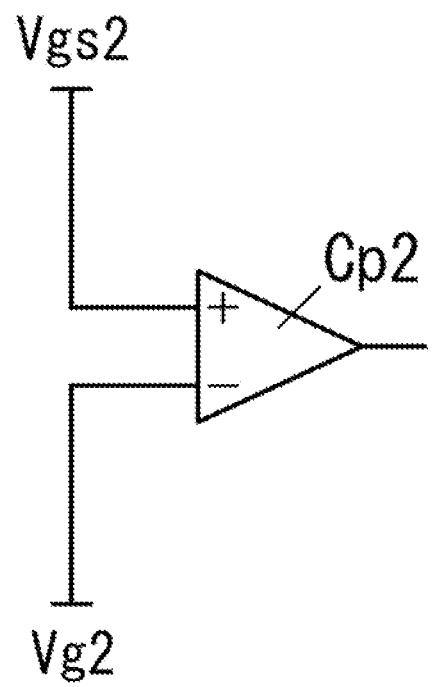
FIG. 6B is a circuit diagram illustrating another configuration example of the second determination circuit in the determination device.

FIG. 6B is a circuit diagram illustrating another configuration example of second determination circuit 32 in determination device 2a. For example, as illustrated in FIG. 6B, in second determination circuit 32, second gate-second source voltage Vgs2 may be input to the non-inverting input terminal of comparator Cp2, and second gate voltage Vg2 of second JFET 12 in a steady state (normal state) may be input to the inverting input terminal of comparator Cp2. Second gate voltage Vg2 in the steady state is, for example, a moving average value of a gate voltage (gate-source voltage Vgs) when second JFET 11 is turned on.

Third Exemplary Embodiment

Figure 7:
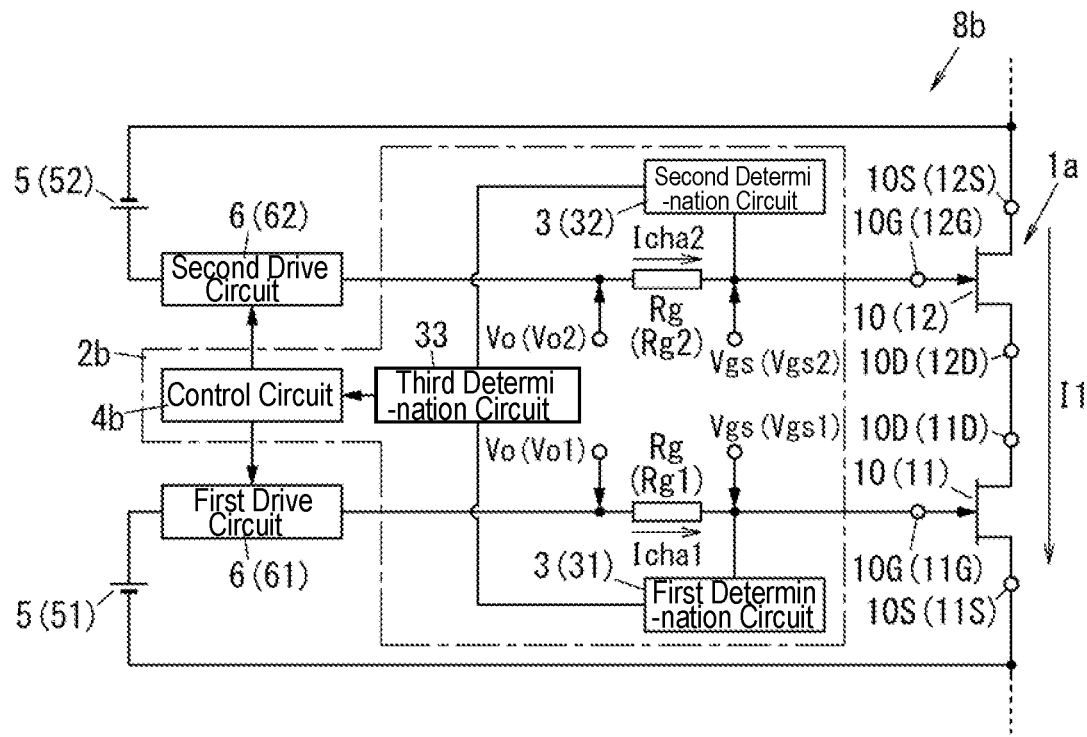
FIG. 7 is an operation explanatory diagram of a switch system including a determination device according to a third exemplary embodiment.

FIG. 7 is an operation explanatory diagram of switch system 8b including determination device 2b according to a third exemplary embodiment. Hereinafter, determination device 2b according to the third exemplary embodiment and switch system 8b equipped therewith will be described with reference to FIG. 7. Switch system 8b according to the third exemplary embodiment includes determination device 2b instead of determination device 2a of switch system 8a according to the second exemplary embodiment. Regarding determination device 2b and switch system 8b according to the third exemplary embodiment, the same components as those of determination device 2a and switch system 8a according to the second exemplary embodiment are denoted by the same reference marks, and the description thereof will be omitted.

Determination device 2b includes third determination circuit 33 that determines that there is an anomaly of semiconductor switch 1a based on the determination result of first determination circuit 31 and the determination result of second determination circuit 32. Determination device 2b further includes control circuit 4b that controls semiconductor switch 1a based on the determination result of third determination circuit 33.

As represented in Table 1 below, third determination circuit 33 determines that there is an anomaly when a level of an output signal of first comparator Cp1 is different from a level of an output signal of second comparator Cp2, and determines that there is no anomaly when the level of the output signal of first comparator Cp1 is the same as the level of the output signal of second comparator Cp2.

TABLE 1

| First comparator | Second comparator | Determination result |
| --- | --- | --- |
| Vgs1 > (Vref1 + ΔV1) | Vgs2 > (Vref2 + ΔV2) | Non-anomaly |
| Vgs1 > (Vref1 + ΔV1) | Vgs2 < (Vref2 + ΔV2) | Anomaly |

TABLE 1-continued

| First comparator | Second comparator | Determination result |
| --- | --- | --- |
| Vgs1 < (Vref1 + ΔV1) | Vgs2 > (Vref2 + ΔV2) | Anomaly |
| Vgs1 < (Vref1 + ΔV1) | Vgs2 < (Vref2 + ΔV2) | Non-anomaly |

In switch system 8b, first determination circuit 31 may be configured to set a logical value of the output signal to 1 when first gate-first source voltage Vgs1 increases, and may be configured to set the logical value of the output signal to −1 when first gate-first source voltage Vgs1 decreases. Second determination circuit 32 may be configured to set the logical value of the output signal to 1 when second gate-second source voltage Vgs2 increases, and may be configured to set the logical value of the output signal to −1 when second gate-second source voltage Vgs2 decreases. Accordingly, as represented in Table 2 below, third determination circuit 33 may be configured to determine that there is an anomaly when the logical value of the determination result of first determination circuit 31 is different from the logical value of the determination result of second determination circuit 32, and may be configured to determine that there is no anomaly when the logical value of the determination result of first determination circuit 31 is the same as the logical value of the determination result of second determination circuit 32.

TABLE 2

| First determination circuit | Second determination circuit | Determination result |
| --- | --- | --- |
| 1 | 1 | Non-anomaly |
| 1 | −1 | Anomaly |
| −1 | 1 | Anomaly |
| −1 | −1 | Non-anomaly |

Control circuit 4b controls first JFET 11 and second JFET 12 based on the determination result of third determination circuit 33. Control circuit 4b controls first JFET 11 and second JFET 12 when the determination result of third determination circuit 33 indicates that there is an anomaly. More specifically, when the determination result in third determination circuit 33 is abnormal, control circuit 4b controls first drive circuit 61 to set first gate drive voltage Vo1 to 0 V and controls second drive circuit 62 to set second gate drive voltage Vo2 to 0 V.

Similar to determination device 2a and switch system 8a according to the second exemplary embodiment, determination device 2b and switch system 8b according to the third exemplary embodiment can suppress the power loss.

Since control circuit 4b is provided in determination device 2b and switch system 8b according to the third exemplary embodiment, it is possible to quickly cut off an overcurrent when the overcurrent flows through semiconductor switch 1a.

As represented in Table 3 below, third determination circuit 33 may be configured to determine a direction of the overcurrent when the level of the output signal of first comparator Cp1 is different from the level of the output signal of second comparator Cp2, and may be configured to determine that there is no anomaly when the level of the output signal of first comparator Cp1 is the same as the level of the output signal of second comparator Cp2.

TABLE 3

| First comparator | Second comparator | Determination result |
| --- | --- | --- |
| Vgs1 > (Vref1 + ΔV1) | Vgs2 > (Vref2 + ΔV2) | Non-anomaly |
| Vgs1 > (Vref1 + ΔV1) | Vgs2 < (Vref2 + ΔV2) | 12S → 11S |
| Vgs1 < (Vref1 + ΔV1) | Vgs2 > (Vref2 + ΔV2) | 11S → 12S |
| Vgs1 < (Vref1 + ΔV1) | Vgs2 < (Vref2 + ΔV2) | Non-anomaly |

Figure 8:
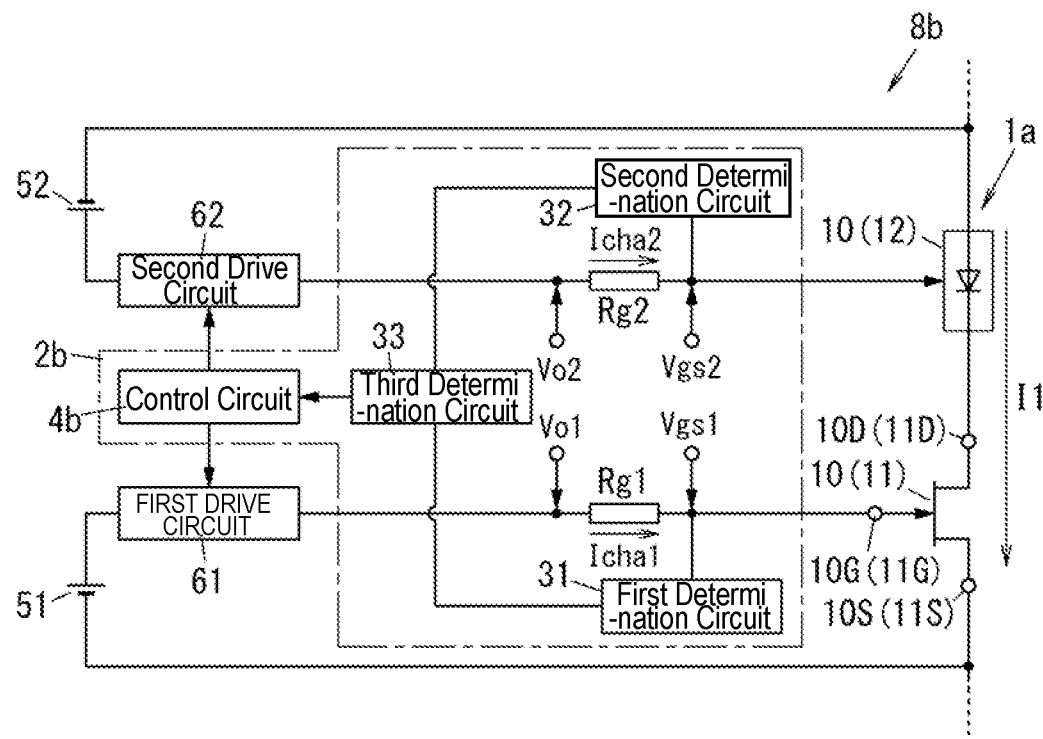
FIG. 8 is an operation explanatory diagram of the switch system including the determination device.

FIG. 8 is an operation explanatory diagram of switch system 8b including determination device 2b. In determination device 2b and switch system 8b according to the third exemplary embodiment, when main current I1 of semiconductor switch 1a is flowing from second source 12S toward first source 11S as illustrated in FIG. 7, second JFET 12 operates in a diode mode as illustrated in FIG. 8. In this state, when first gate-first source voltage Vgs1 of first JFET 11 is higher than a first reference voltage (Vref1 or Vref1+AV1) and second gate-second source voltage Vgs2 of second JFET 12 is lower than a second reference voltage (Vref2 or Vref2+AV2), control circuit 4b first turns off first JFET 11 out of first JFET 11 and second JFET 12.

On the other hand, when main current I1 of semiconductor switch 1a flows from first source 11S toward second source 12S, first JFET 11 operates in the diode mode. In this state, when first gate-first source voltage Vgs1 of first JFET 11 is lower than the first reference voltage and second gate-second source voltage Vgs2 of second JFET 12 is higher than the second reference voltage, control circuit 4b first turns off second JFET 12 out of first JFET 11 and second JFET 12.

In determination device 2b and switch system 8b according to the third exemplary embodiment, a timing at which control circuit 4b turns off first JFET 11 and a timing at which the control circuit turns off second JFET 12 are set to be different from each other as described above, and thus, it is possible to suppress heat generation in semiconductor switch 1a when semiconductor switch 1a is turned off.

Fourth Exemplary Embodiment

Figure 9:
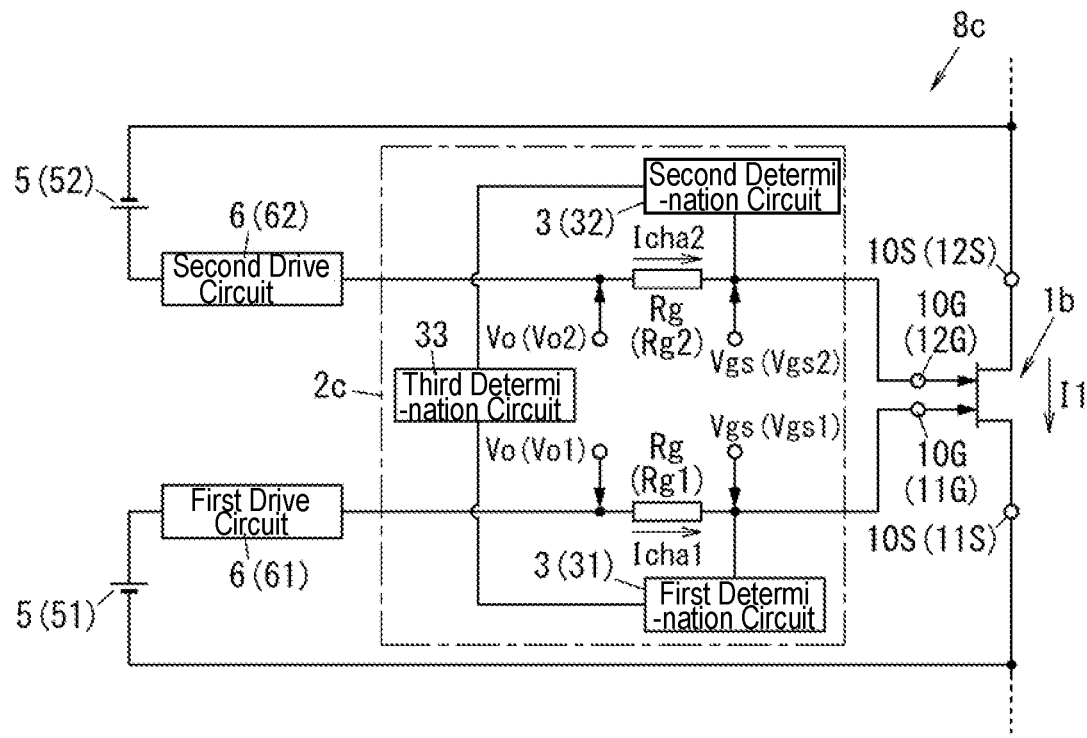
FIG. 9 is a circuit diagram of a switch system including a determination device according to a fourth exemplary embodiment.

FIG. 9 is a circuit diagram of switch system 8c including determination device 2c according to a fourth exemplary embodiment. Hereinafter, determination device 2c according to the fourth exemplary embodiment and switch system 8c equipped therewith will be described with reference to FIG. 9. Switch system 8c according to the fourth exemplary embodiment includes semiconductor switch 1b and determination device 2c instead of semiconductor switch 1a and determination device 2b of switch system 8b according to the third exemplary embodiment. Regarding determination device 2c and switch system 8c according to the fourth exemplary embodiment, the same components as those of determination device 2b and switch system 8b according to the third exemplary embodiment are denoted by the same reference marks, and the description thereof will be omitted.

Semiconductor switch 1b is dual-gate type junction field-effect transistor 10b (hereinafter, also referred to as JFET 10b) having two gates 10G and two sources 10S, and can be used as a bidirectional switch. Two gates 10G and two sources 10S have a one-to-one correspondence. Hereinafter, for the sake of convenience in description, one of two gates 10G may be referred to as first gate 11G, and the other may be referred to as second gate 12G. Of two sources 10S, source 10S corresponding to first gate 11G may be referred to as first source 11S, and source 10S corresponding to second gate 12G may be referred to as second source 12S.

Hereinafter, semiconductor switch 1b will be briefly described, and then determination device 2c and switch system 8c will be described.

JFET 10b is a kind of GaN-based GIT. JFET 10b includes, for example, a substrate, a buffer layer, a first nitride semiconductor layer, a second nitride semiconductor layer, a first source electrode, a first gate electrode, a second gate electrode, a second source electrode, a first p-type layer, and a second p-type layer. The buffer layer is formed on the substrate. The first nitride semiconductor layer is formed on the buffer layer. The second nitride semiconductor layer is formed on the first nitride semiconductor layer. The first source electrode, the first gate electrode, the second gate electrode, and the second source electrode are formed on the second nitride semiconductor layer. The first p-type layer is interposed between the first gate electrode and the second nitride semiconductor layer. The second p-type layer is interposed between the second gate electrode and the second nitride semiconductor layer. In JFET 10b, first source 11S includes a first source electrode. First gate 11G includes a first gate electrode and a first p-type layer. Second gate 12G includes a second gate electrode and a second p-type layer. Second source 12S includes a second source electrode. The substrate is, for example, a silicon substrate. The buffer layer is, for example, an undoped GaN layer. The first nitride semiconductor layer is, for example, an undoped GaN layer. The second nitride semiconductor layer is, for example, an undoped AlGaN layer. Each of the first p-type layer and the second p-type layer is, for example, a p-type AlGaN layer. Each of the buffer layer, the first nitride semiconductor layer, and the second nitride semiconductor layer may contain impurities such as Mg, H, Si, C, and O inevitably mixed during growth by MOVPE or the like.

In JFET 10b, the second nitride semiconductor layer constitutes a heterojunction together with the first nitride semiconductor layer. In the first nitride semiconductor layer, a two-dimensional electron gas is generated near the heterojunction. A region containing the two-dimensional electron gas (hereinafter, also referred to as a "two-dimensional electron gas layer") can function as an n-channel layer (electron conduction layer).

Hereinafter, for the sake of convenience in description, a state where a voltage equal to or greater than a first threshold voltage (for example, 1.3 V) is not applied between first gate 11G and first source 11S is also referred to as an off-state of first gate 11G. A state where a voltage equal to or greater than the first threshold voltage is applied between first gate 11G and first source 11S with first gate 11G on a high potential side is also referred to as an on-state of first gate 11G. A state where a voltage equal to or greater than a second threshold voltage (for example, 1.3 V) is not applied between second gate 12G and second source 12S is also referred to as an off-state of second gate 12G. A state where a voltage equal to or greater than the second threshold voltage is applied between second gate 12G and second source 12S with second gate 12G on a high potential side is also referred to as an on-state of second gate 12G.

JFET 10b includes the above-described first p-type layer and second p-type layer to achieve a JFET having a normally-off characteristic.

JFET 10b can switch between a bidirectional on-state, a bidirectional off-state, a first diode state, and a second diode state according to a combination of the first gate voltage and the second gate voltage provided to first gate 11G and second gate 12G, respectively. The first gate voltage is a voltage (first gate-first source voltage Vgs1) applied between first gate 11G and first source 11S. The second gate voltage is a voltage (second gate-second source voltage Vgs2) applied between second gate 12G and second source 12S. The bidirectional on-state is a state where a bidirectional (a first direction and a second direction opposite to the first direction) current passes therethrough. The bidirectional off-state is a state where a bidirectional current is blocked. The first diode state is a state where the current in the first direction passes. The second diode state is a state where the current in the second direction passes.

In JFET 10b, the bidirectional on-state is established when first gate 11G is in the on-state and second gate 12G is in the on-state. In JFET 10b, the bidirectional off-state is established when first gate 11G is in the off-state and second gate 12G is in the off-state. In JFET 10b, the first diode state is established when first gate 11G is in the off-state and second gate 12G is in the on-state. In JFET 10b, the second diode state is established when first gate 11G is in the on-state and second gate 12G is in the off-state.

Next, determination device 2c and switch system 8c will be described.

Similar to determination device 2b according to the third exemplary embodiment, determination device 2c includes two resistors Rg and two determination circuits 3. Two resistors Rg include first resistor Rg1 connected to first gate 11G and second resistor Rg2 connected to second gate 12G. Two determination circuits 3 include first determination circuit 31 corresponding to first gate 11G and first source 11S, and second determination circuit 32 corresponding to second gate 12G and second source 12S. Determination device 2c further includes third determination circuit 33. Third determination circuit 33 determines that there is an anomaly of semiconductor switch 1b based on the determination result of first determination circuit 31 and the determination result of second determination circuit 32.

Operations of determination device 2c and switch system 8c are similar to the operations of determination device 2b and switch system 8b according to the third exemplary embodiment.

Figure 10:
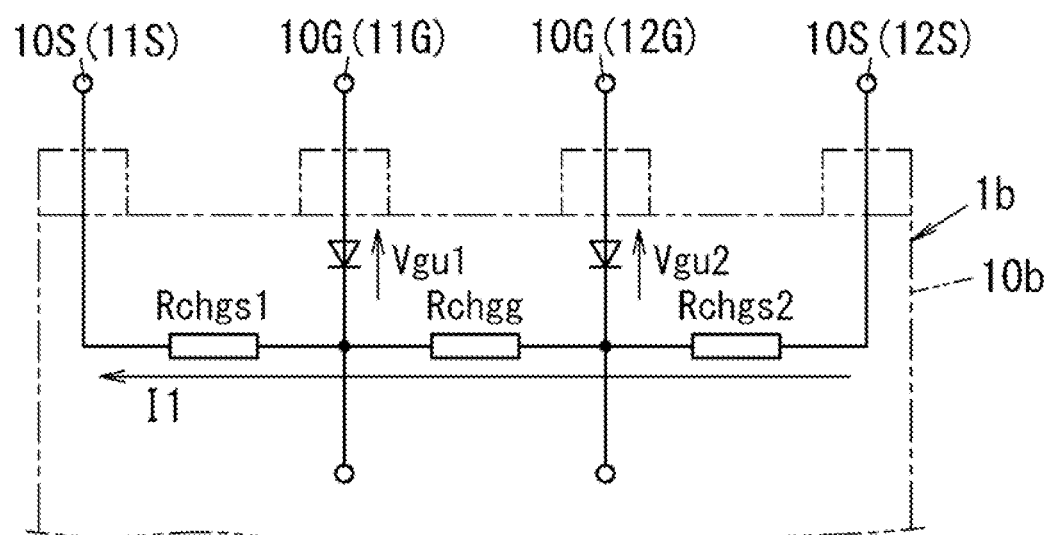
FIG. 10 is an operation explanatory diagram of the switch system including the determination device.
Figure 11:
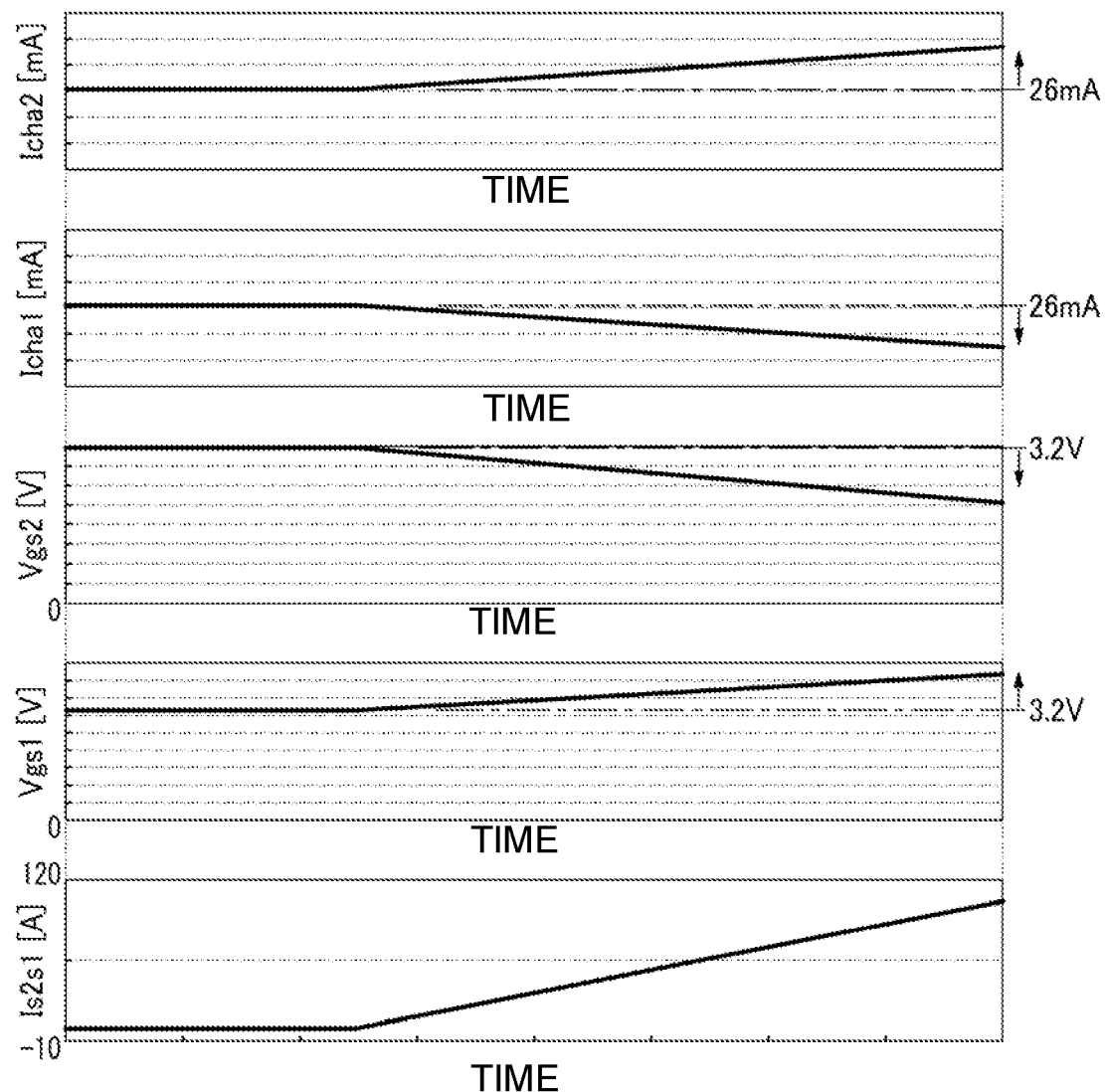
FIG. 11 is an operation explanatory diagram of the switch system including the determination device.

FIGS. 10 and 11 are operation explanatory diagrams of switch system 8c including determination device 2c. An operation example of switch system 8c will be described with reference to FIGS. 10 and 11.

In FIG. 10, voltage Vgu1 voltage Vgu2, channel resistance Rchgs1, channel resistance Rchgs2, internal resistance Rchgg, and main current I1 are depicted on a schematic equivalent circuit of JFET 10b. Voltage Vgu1 is a voltage applied to a diode of first gate 11G. Voltage Vgu2 is a voltage applied to a diode of second gate 12G. Channel resistance Rchgs1 is a channel resistance between the first gate and the first source of JFET 10b. Channel resistance Rchgs2 is a channel resistance between the second gate and the second source of JFET 10b. Internal resistance Rchgg is an internal resistance between channel resistance Rchgs1 and channel resistance Rchgs2. Main current I1 is a current flowing from second source 12S toward first source 11S.

In FIG. 11, main current I1 flowing from second source 12S to first source 11S is denoted by Is2s1, the first gate-first source voltage is denoted by Vgs1, the second gate-second source voltage is denoted by Vgs2, the first charge current flowing through first resistor Rg1 is denoted by Icha1, and the second charge current flowing through second resistor Rg2 is denoted by Icha2, and time changes thereof are illustrated. When semiconductor switch 1b is in the on-state and the overcurrent is not flowing through semiconductor switch 1b, main current Is2s1, first gate-first source voltage Vgs1, second gate-second source voltage Vgs2, first charge current Icha1, and second charge current Icha2 are substantially constant. On the other hand, when main current Is2s1 from second source 12S to first source 11S increases, first gate-first source voltage Vgs1 increases, and first charge current Icha1 decreases. When main current Is2s1 from second source 12S to first source 11S increases, second gate-second source voltage Vgs2 decreases, and second charge current Icha2 increases.

Similar to determination device 2b and switch system 8b according to the third exemplary embodiment, determination device 2c and switch system 8c according to the fourth exemplary embodiment can suppress the power loss.

Determination device 2c according to the fourth exemplary embodiment may include a control circuit similar to control circuit 4b included in determination device 2b according to the third exemplary embodiment.

Fifth Exemplary Embodiment

Figure 12:
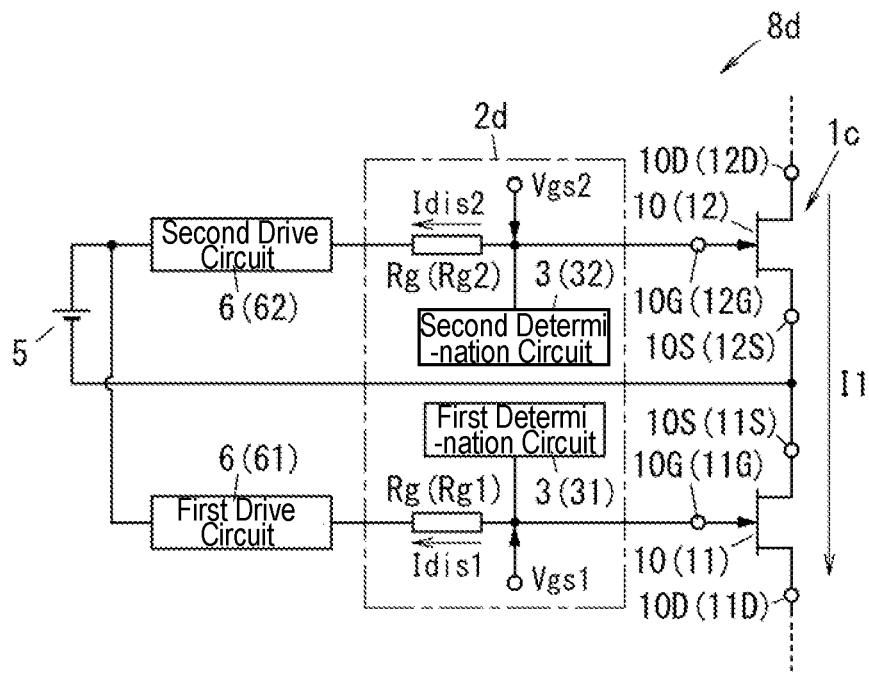
FIG. 12 is a circuit diagram of a switch system including a determination device according to a fifth exemplary embodiment.

FIG. 12 is a circuit diagram of switch system 8d including determination device 2d according to a fifth exemplary embodiment. Hereinafter, determination device 2d according to the fifth exemplary embodiment and switch system 8d equipped therewith will be described with reference to FIG. 12.

Switch system 8d according to the fifth exemplary embodiment includes semiconductor switch 1c and determination device 2d instead of semiconductor switch 1a and determination device 2a of switch system 8a according to the second exemplary embodiment. Regarding determination device 2d and switch system 8d according to the fifth exemplary embodiment, the same components as those of determination device 2a and switch system 8a according to the second exemplary embodiment are denoted by the same reference marks, and the description thereof will be omitted.

In semiconductor switch 1a, first drain 11D of first JFET 11 and second drain 12D of second JFET 12 are connected, whereas in semiconductor switch 1c, first source 11S of first JFET 11 and second source 12S of second JFET 12 are connected.

In switch system 8d, one DC power supply 5 is shared by first drive circuit 61 and second drive circuit 62, and an output terminal on a low potential side of DC power supply 5 is connected to a node between first source 11S of first JFET 11 and second source 12S of second JFET 12.

In semiconductor switch 1c, first drain 11D of first JFET 11 and second drain 12D of second JFET 12 constitute a pair of main terminals. Switch system 8d is used by connecting a load circuit between first drain 11D and second drain 12D.

Figure 13:
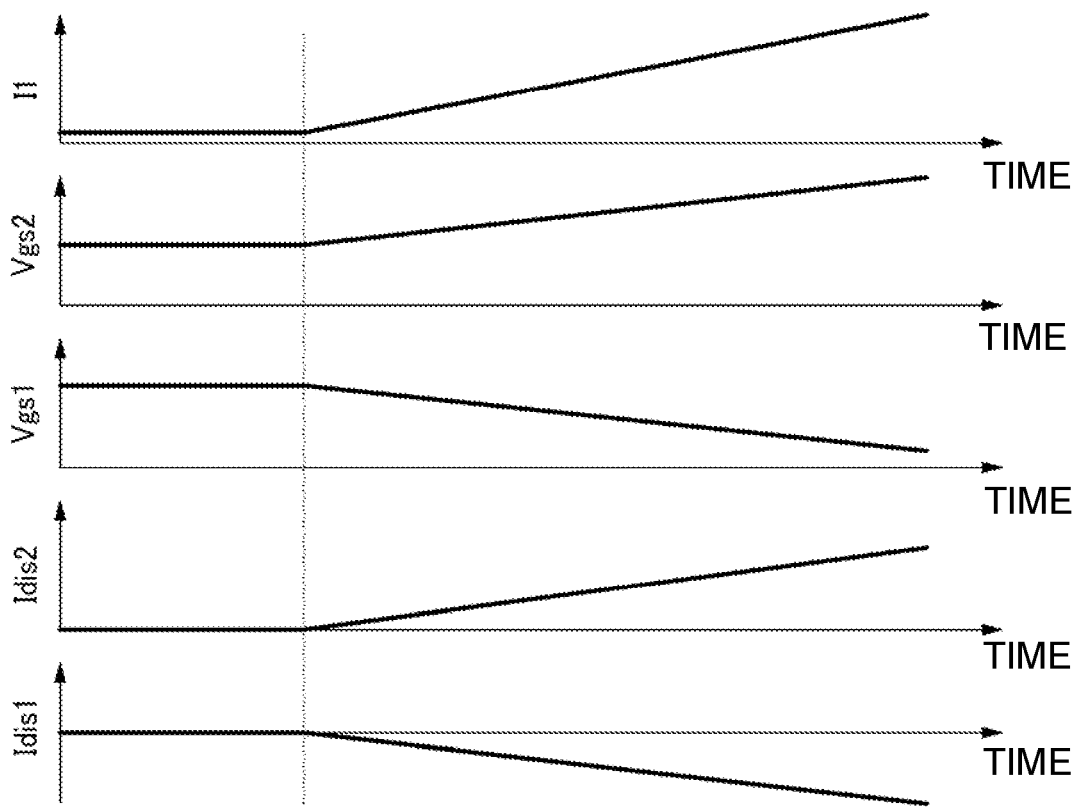
FIG. 13 is an operation explanatory diagram of the switch system including the determination device.

FIG. 13 is an operation explanatory diagram of switch system 8d including determination device 2d. In FIG. 13, a main current flowing from second drain 12D to first drain 11D is denoted by I1, the first gate-first source voltage is denoted by Vgs1, the second gate-second source voltage is denoted by Vgs2, a first discharge current flowing through first resistor Rg1 is denoted by Idis1, and a second discharge current flowing through second resistor Rg2 is denoted by Idis2, and time changes thereof are illustrated. When semiconductor switch 1c is in the on-state and no overcurrent flows through semiconductor switch 1c, each of main current I1, first gate-first source voltage Vgs1, second gate-second source voltage Vgs2, first discharge current Idis1, and second discharge current Idis2 is substantially constant. On the other hand, when main current I1 from second drain 12D to first drain 11D increases, first gate-first source voltage Vgs1 decreases, and first discharge current Idis1 decreases. When main current I1 flowing from second drain 12D to first drain 11D increases, second gate-second source voltage Vgs2 increases, and second discharge current Idis2 increases.

Similar to determination device 2a and switch system 8a according to the second exemplary embodiment, determination device 2d and switch system 8d according to the fifth exemplary embodiment can suppress the power loss.

Figure 14:
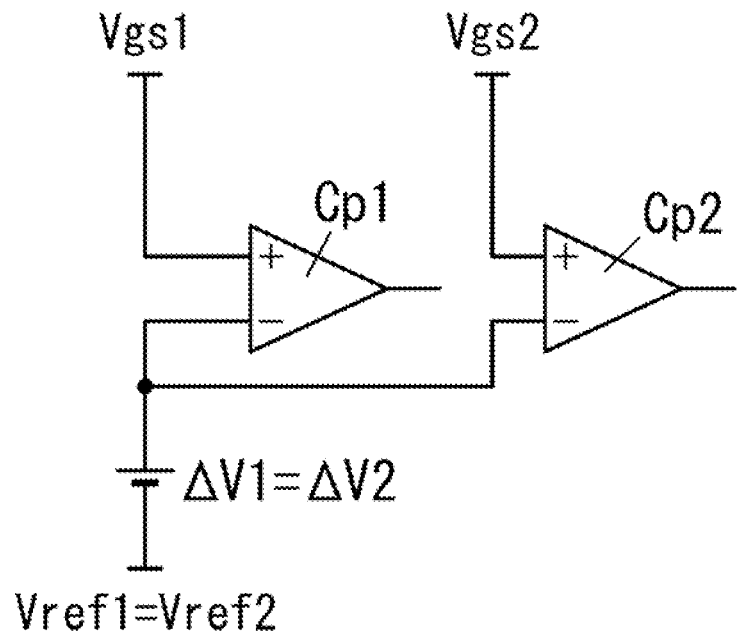
FIG. 14 is a circuit diagram of a main part of the determination device.

In determination device 2d according to the fifth exemplary embodiment, a reference potential of first drive circuit 61 and a reference potential of second drive circuit 62 can be set to be the same. FIG. 14 is a circuit diagram of a main part of determination device 2a. As illustrated in FIG. 14, first reference voltage Vref1 and second reference voltage Vref2 can be set to be the same, and ΔV1 and ΔV2 can be set to be the same. As a result, in determination device 2d, the circuit configuration can be simplified, and the size of determination device 2d can be reduced.

Similar to third determination circuit 33 included in determination device 2b according to the third exemplary embodiment, determination device 2d according to the fifth exemplary embodiment may include a third determination circuit.

As represented in Table 4 below, the third determination circuit may be configured to determine a direction of an overcurrent when a level of an output signal of first comparator Cp1 is different from a level of an output signal of second comparator Cp2, and may be configured to determine that there is no anomaly when the level of the output signal of first comparator Cp1 is the same as the level of the output signal of second comparator Cp2.

TABLE 4

| First comparator | Second comparator | Determination result |
|---|---|---|
| Vgs1 > (Vref1 + ΔV1) | Vgs2 > (Vref2 + ΔV2) | Non-anomaly |
| Vgs1 > (Vref1 + ΔV1) | Vgs2 < (Vref2 + ΔV2) | 11D → 12D |
| Vgs1 < (Vref1 + ΔV1) | Vgs2 > (Vref2 + ΔV2) | 12D → 11D |
| Vgs1 < (Vref1 + ΔV1) | Vgs2 < (Vref2 + ΔV2) | Non-anomaly |

Sixth Exemplary Embodiment

Figure 15:
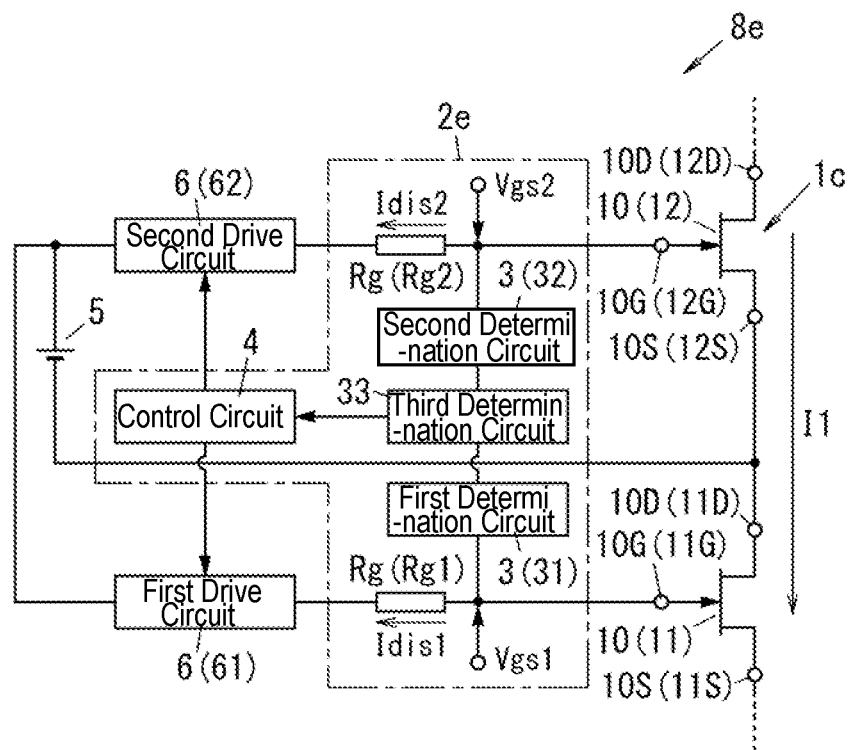
FIG. 15 is a circuit diagram of a switch system including a determination device according to a sixth exemplary embodiment.

FIG. 15 is a circuit diagram of switch system 8e including determination device 2e according to a sixth exemplary embodiment. Hereinafter, determination device 2e according to the sixth exemplary embodiment and switch system 8e equipped therewith will be described with reference to FIG. 15.

Determination device 2e and switch system 8e according to the sixth exemplary embodiment are different from determination device 2d and switch system 8d according to the fifth exemplary embodiment in including control circuit 4. Regarding determination device 2e and switch system 8e according to the sixth exemplary embodiment, the same components as those of determination device 2d and switch system 8d according to the fifth exemplary embodiment are denoted by the same reference marks, and the description thereof will be omitted.

Control circuit 4 controls first JFET 11 and second JFET 12 based on the determination result of third determination circuit 33. Control circuit 4 controls first JFET 11 and second JFET 12 when the determination result of third determination circuit 33 indicates that there is an anomaly. More specifically, when the determination result in third determination circuit 33 is abnormal, control circuit 4 controls first drive circuit 61 to set first gate drive voltage Vo1 to 0 V and controls second drive circuit 62 to set second gate drive voltage Vo2 to 0 V.

Similar to determination device 2a and switch system 8a according to the fifth exemplary embodiment, determination device 2e and switch system 8e according to the sixth exemplary embodiment can suppress the power loss.

Since control circuit 4 is provided in determination device 2e and switch system 8e according to the sixth exemplary embodiment, it is possible to quickly cut off an overcurrent when the overcurrent flows through semiconductor switch 1c.

Each of the first to sixth exemplary embodiments described above are merely one of various exemplary embodiments of the present disclosure. The first to sixth exemplary embodiments described above can be variously changed according to a design and the like as long as the object of the present disclosure can be achieved.

Figure 16:
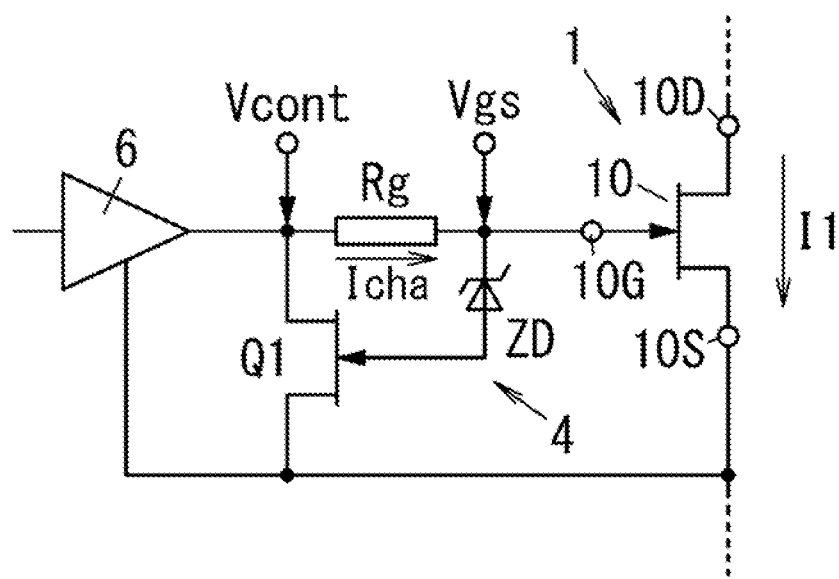
FIG. 16 is a circuit diagram of a control circuit in a determination device according to a modification.

For example, regarding determination device 2 and switch system 8 according to the first exemplary embodiment, as illustrated in FIG. 16, determination circuit 3 described above may include Zener diode ZD, and control circuit 4 may include normally-off transistor Q1. In the circuit of FIG. 16, potential Vcont of a path between drive circuit 6 and resistor Rg is normally at a high (H) level (for example, 12 V), and becomes a low (L) level (for example, 0 V) when an overcurrent flows through semiconductor switch 1 and gate-source voltage Vgs increases, and thus, the operation of drive circuit 6 is stopped.

The case where determination circuit 3 determines that the overcurrent is flowing includes a case where the output of determination circuit 3 is different between when the overcurrent is flowing and when the overcurrent is not flowing.

The p-type layer in the semiconductor switches 1, 1a, and 1c is not limited to the p-type AlGaN layer, and may be, for example, a p-type GaN layer or a p-type metal oxide semiconductor layer. The p-type metal oxide semiconductor layer is, for example, a NiO layer. For example, the NiO layer may contain, as an impurity, at least one alkali metal selected from the group of lithium, sodium, potassium, rubidium, and cesium. The NiO layer may contain, for example, a transition metal such as silver or copper that becomes monovalent when added as an impurity. Each of the first p-type layer and the second p-type layer in semiconductor switch 1b is the same as the p-type layer in semiconductor switches 1, 1a, and 1c.

Each of semiconductor switches 1 and 1a to 1c may include one or more nitride semiconductor layers between the buffer layer and the first nitride semiconductor layer. The buffer layer is not limited to a single layer structure, and may have, for example, a superlattice structure.

The substrate in each of semiconductor switches 1 and 1a to 1c is not limited to the silicon substrate, and may be, for example, a GaN substrate, a SiC substrate, a sapphire substrate, or the like.

Semiconductor switches 1 to 1c can be applied to, for example, an electric device such as a circuit breaker, a multi-level inverter, a dimming device, or a matrix converter that performs AC-AC power conversion.

Aspects

The following aspects are disclosed based on the above-described exemplary embodiments and the like in this specification.

Determination device (2; 2a; 2b; 2c; 2d; 2e) according to a first aspect is used for semiconductor switch (1). Semiconductor switch (1; 1a; 1b; 1c) includes junction field-effect transistor (10) having gate (10G) and source (10S) corresponding to gate (10G).

Determination device (2) includes resistor (Rg) and determination circuit (3). Resistor (Rg) has a first end and a second end. The first end of resistor (Rg) is connected to gate (10G). When there is a predetermined change in gate-source voltage (Vgs) of junction field-effect transistor (10) within a range smaller than gate drive voltage (Vo) applied between the second end of resistor (Rg) and source (10S), determination circuit (3) determines that an overcurrent is flowing through semiconductor switch (1; 1a; 1b; 1c).

Determination device (2; 2a; 2b; 2c; 2d; 2e) according to the first aspect can suppress the power loss.

In the first aspect, in determination device (2; 2a; 2b; 2c; 2d; 2e) according to a second aspect, the predetermined change includes a change determined by a threshold.

In determination device (2; 2a; 2b; 2c; 2d) according to the second aspect, determination circuit (3) can be a comparator.

In the first aspect, in determination device (2; 2a; 2b; 2c; 2d) according to a third aspect, the predetermined change includes a change determined by the amount of change.

In determination device (2; 2a; 2b; 2c; 2d) according to the third aspect, the erroneous detection of the overcurrent can be suppressed.

Determination device (2a) according to a fourth aspect is based on the first aspect. Semiconductor switch (1a) is a bidirectional switch including two junction field-effect transistors (10). Two junction field-effect transistors (10) include first junction field-effect transistor (11) and second junction field-effect transistor (12). Determination device (2a) includes two resistors (Rg) and two determination circuits (3). Two resistors (Rg) include first resistor (Rg1) corresponding to first junction field-effect transistor (11) and second resistor (Rg2) corresponding to second junction field-effect transistor (12). Two determination circuits (3) include first determination circuit (31) corresponding to first junction field-effect transistor (11) and second determination circuit (32) corresponding to second junction field-effect transistor (12).

Determination device (2a) according to the fourth aspect can determine whether or not an overcurrent is flowing through the bidirectional switch.

In the fourth aspect, in determination device (2a) according to a fifth aspect, first determination circuit (31) compares gate-source voltage (Vgs1) of first junction field-effect transistor (11) with first threshold (Vref1+AV1). Second determination circuit (32) compares gate-source voltage (Vgs2) of second junction field-effect transistor (12) with second threshold (Vref2+AV2).

In determination device (2a) according to the fifth aspect, first determination circuit (31) can be constituted by using comparator (Cp1), and second determination circuit (32) can be constituted by using comparator (Cp2).

In the fourth aspect, in determination device (2a) according to a sixth aspect, first determination circuit (31) compares gate-source voltage (Vgs1) of first junction field-effect transistor (11) with moving average value (Vg1) of the gate voltage when first junction field-effect transistor (11) is turned on. Second determination circuit (32) compares gate-source voltage (Vgs2) of second junction field-effect transistor (12) with moving average value (Vg2) of the gate voltage when second junction field-effect transistor (12) is turned on.

In determination device (2a) according to the sixth aspect, first determination circuit (31) can be constituted by using comparator (Cp1), and second determination circuit (32) can be constituted by using comparator (Cp2).

In any one of the fourth to sixth aspects, determination device (2b) according to a seventh aspect further includes third determination circuit (33) that determines that there is an anomaly of semiconductor switch (1a) based on the determination result of first determination circuit (31) and the determination result of second determination circuit (32).

In determination device (2b) according to the seventh aspect, it is possible to determine that there is an anomaly of semiconductor switch (1a).

In the seventh aspect, in determination device (2b) according to an eighth aspect, third determination circuit (33) determines a direction in which the overcurrent is flowing.

In determination device (2b) according to the eighth aspect, the direction in which the overcurrent is flowing can be determined.

In the eighth aspect, in determination device (2b) according to a ninth aspect, determination device (2b) further includes control circuit (4b). Control circuit (4b) controls first junction field-effect transistor (11) and second junction field-effect transistor (12) based on the determination result of third determination circuit (33). When gate-source voltage (Vgs1) of first junction field-effect transistor (11) is higher than the first reference voltage and gate-source voltage (Vgs2) of second junction field-effect transistor (12) is lower than the second reference voltage, control circuit (4b) first turns off first junction field-effect transistor (11) out of first junction field-effect transistor (11) and second junction field-effect transistor (12). When gate-source voltage (Vgs1) of first junction field-effect transistor (11) is lower than the first reference voltage and gate-source voltage (Vgs2) of second junction field-effect transistor (12) is higher than the second reference voltage, control circuit 4 first turns off second junction field-effect transistor (12) out of first junction field-effect transistor (11) and second junction field-effect transistor (12).

Determination device (2b) according to the ninth aspect can suppress a temperature rise in semiconductor switch (1; 1a; 1c) when the overcurrent is caused to flow through semiconductor switch (1; 1a; 1c) and semiconductor switch (1; 1a; 1c) is turned off.

In the first aspect, in determination device (2c) according to a tenth aspect, semiconductor switch (1b) is a dual-gate junction field-effect transistor having two gates (10G) and two sources (10S). Two gates (10G) include first gate (11G) and second gate (12G). Two sources (10S) include first source (11S) corresponding to first gate (11G) and second source (12S) corresponding to second gate (12G). Determination device (2c) includes two resistors (Rg) and two determination circuits (3). Two resistors (Rg) include first resistor (Rg1) connected to first gate (11G) and second resistor (Rg2) connected to second gate (12G). Two determination circuits (3) include first determination circuit (31) corresponding to first gate (11G) and first source (11S), and second determination circuit (32) corresponding to second gate (12G) and second source (12S). Determination device (2c) further includes third determination circuit (33). Third determination circuit (33) determines that there is an anomaly of semiconductor switch (1b) based on the determination result of first determination circuit (31) and the determination result of second determination circuit (32).

In determination device (2) according to the tenth aspect, it is possible to determine that there is an anomaly of semiconductor switch (1b).

Determination device (2e) according to an eleventh aspect is based on the seventh aspect. In semiconductor switch (1c), gate (10G) and source (10S) of first junction field-effect transistor (11) are first gate (11G) and first source (11S), respectively. Gate (10G) and source (10S) of second junction field-effect transistor (12) are second gate (12G) and second source (12S), respectively. First source (11S) of first junction field-effect transistor (11) and second source (12S) of second junction field-effect transistor (12) are connected. Determination device (2e) further includes control circuit (4). Control circuit (4) controls first junction field-effect transistor (11) and second junction field-effect transistor (12) based on the determination result of third determination circuit (33). Third determination circuit (33) determines that semiconductor switch (1c) is abnormal when the voltage between second gate (12G) and second source (12S) is higher than the first reference voltage and the voltage between first gate (11G) and first source (11S) decreases.

Determination device (2e) according to the eleventh aspect can determine that there is an anomaly of semiconductor switch (1c).

Determination device (2) according to a twelfth aspect is based on the fifth aspect. In semiconductor switch (1), gate (10G) and source (10S) of first junction field-effect transistor (11) are first gate (11G) and first source (11S), respectively. Gate (10G) and source (10S) of second junction field-effect transistor (12) are second gate (12G) and second source (12S), respectively. First source (11S) of first junction field-effect transistor (11) and second source (12S) of second junction field-effect transistor (12) are connected. First threshold (Vref1+AV1) and second threshold (Vref2+AV2) are the same.

In determination device (2a) according to the twelfth aspect, the circuit configuration can be simplified and downsized.

Switch system (8; 8a; 8b; 8c; 8d; 8e) according to a thirteenth aspect includes determination device (2; 2a; 2b; 2c; 2d; 2e) according to any one of the first to twelfth aspects and semiconductor switch (1; 1a; 1b; 1c).

Switch system (8; 8a; 8b; 8c; 8d; 8e) according to the thirteenth aspect can suppress the power loss.

The determination device of the present disclosure and the switch system equipped therewith can suppress the power loss. Thus, the determination device of the present disclosure and the switch system equipped therewith lead to power saving of the semiconductor device and the electronic device equipped therewith, and are industrially useful.

The invention claimed is:

1. A determination device used for a semiconductor switch including a junction field-effect transistor having a gate and a source corresponding to the gate, the device comprising:
   a resistor that has a first end and a second end, the first end being connected to the gate; and
   a determination circuit that determines that an overcurrent is flowing through the semiconductor switch when there is a predetermined change in a gate-source voltage of the junction field-effect transistor in a range smaller than a gate drive voltage given between the second end of the resistor and the source, wherein
   the semiconductor switch is a bidirectional switch including two junction field-effect transistors,
   the two junction field-effect transistors include a first junction field-effect transistor and a second junction field-effect transistor,
   the determination device includes two resistors, and two determination circuits,
   the two resistors include a first resistor corresponding to the first junction field-effect transistor and a second resistor corresponding to the second junction field-effect transistor, and
   the two determination circuits include a first determination circuit corresponding to the first junction field-effect transistor and a second determination circuit corresponding to the second junction field-effect transistor.

2. The determination device according to claim 1, wherein the predetermined change includes a change determined by a threshold.

3. The determination device according to claim 1, wherein the predetermined change includes a change determined by an amount of change.

4. The determination device according to claim 1, wherein
   the first determination circuit compares the gate-source voltage of the first junction field-effect transistor with a first threshold, and
   the second determination circuit compares the gate-source voltage of the second junction field-effect transistor with a second threshold.

5. The determination device according to claim 1, wherein
   the first determination circuit compares the gate-source voltage of the first junction field-effect transistor with a moving average value of a gate voltage when the first junction field-effect transistor is turned on, and
   the second determination circuit compares the gate-source voltage of the second junction field-effect transistor with a moving average value of a gate voltage when the second junction field-effect transistor is turned on.

6. The determination device according to claim 1, further comprising a third determination circuit that determines whether or not there is an anomaly of the semiconductor switch based on a determination result of the first determination circuit and a determination result of the second determination circuit.

7. The determination device according to claim 6, wherein the third determination circuit determines a direction in which the overcurrent is flowing.

8. The determination device according to claim 7, further comprising a control circuit that controls the first junction field-effect transistor and the second junction field-effect transistor based on a determination result of the third determination circuit, wherein the control circuit first turns off the first junction field-effect transistor out of the first junction field-effect transistor and the second junction field-effect transistor when the gate-source voltage of the first junction field-effect transistor is higher than a first reference voltage and the gate-source voltage of the second junction field-effect transistor decreases from a second reference voltage, and first turns off the second junction field-effect transistor out of the first junction field-effect transistor and the second junction field-effect transistor when the gate-source voltage of the first junction field-effect transistor is lower than the first reference voltage and the gate-source voltage of the second junction field-effect transistor increases from the second reference voltage.

9. A determination device used for a semiconductor switch including a junction field-effect transistor having a gate and a source corresponding to the gate, the device comprising:

a resistor that has a first end and a second end, the first end being connected to the gate; and a determination circuit that determines that an overcurrent is flowing through the semiconductor switch when there is a predetermined change in a gate-source voltage of the junction field-effect transistor in a range smaller than a gate drive voltage given between the second end of the resistor and the source, wherein the semiconductor switch is a dual-gate type junction field-effect transistor having two gates and two sources, the two gates include a first gate and a second gate, the two sources include a first source corresponding to the first gate and a second source corresponding to the second gate, the determination device includes two resistors, and includes two determination circuits, the two resistors include a first resistor connected to the first gate, and a second resistor connected to the second gate, the two determination circuits include a first determination circuit corresponding to the first gate and the first source, and a second determination circuit corresponding to the second gate and the second source, and the determination device further includes a third determination circuit that determines whether or not there is an anomaly of the semiconductor switch based on a determination result of the first determination circuit and a determination result of the second determination circuit.

10. The determination device according to claim 6, wherein in the semiconductor switch, the gate and the source of the first junction field-effect transistor are a first gate and a first source, respectively, the gate and the source of the second junction field-effect transistor are a second gate and a second source, respectively, and the first source of the first junction field-effect transistor and the second source of the second junction field-effect transistor are connected, the determination device further includes a control circuit that controls the first junction field-effect transistor and the second junction field-effect transistor based on a determination result of the third determination circuit, and the third determination circuit determines that the semiconductor switch is abnormal when a voltage between the second gate and the second source is higher than a first reference voltage and a voltage between the first gate and the first source decreases.

11. The determination device according to claim 4, wherein, in the semiconductor switch, the gate and the source of the first junction field-effect transistor are a first gate and a first source, respectively, the gate and the source of the second junction field-effect transistor are a second gate and a second source, respectively, the first source of the first junction field-effect transistor and the second source of the second junction field-effect transistor are connected, and the first threshold and the second threshold are same.

12. A switch system comprising:
the determination device according to claim 1; and
the semiconductor switch.

13. A switch system comprising:
the determination device according to claim 9; and
the semiconductor switch.

* * * * *